United States Patent Office 3,234,481

Patented Feb. 8, 1966

3,234,481

HIGH-FREQUENCY TRANSFORMER ASSEMBLY INCLUDING SHIELDING MEANS FOR USE WITH TRANSISTOR CIRCUITRY

Hisao Maeda, 13 Shiba-Koen, Minato-ku, Tokyo-to, Japan

Filed Aug. 2, 1961, Ser. No. 128,845
Claims priority, application Japan, Aug. 13, 1960, 35/34,994
2 Claims. (Cl. 330—31)

This invention relates to a high frequency transformer assembly for use with transistors wherein at least the high-frequency, high-potential side of a high-frequency transformer and the high-potential portions of a transistor and a neutralizing condenser, which are connected with the high-potential sides, are contained in a shield can. A principal object of this invention is to provide an amplifier system which is capable of high gain without the accompaniment of any spurious oscillation, and wherein the undersirable effect of higher harmonics due to wave distortion created by the amplifier system is small.

Figures 1, 2:
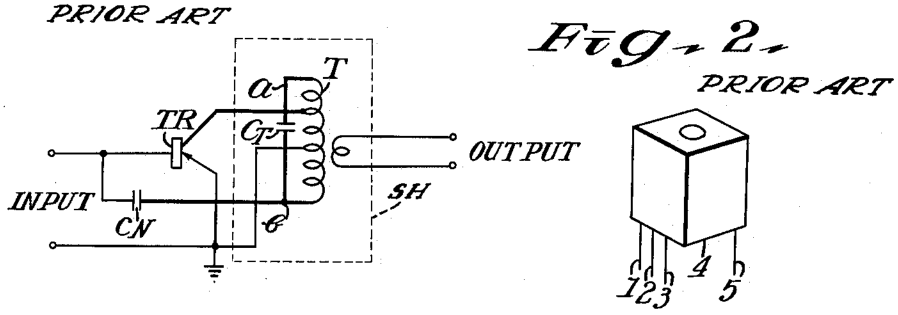
Figure 3:
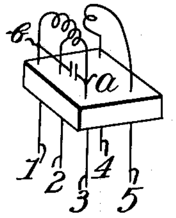
Fig. 3 PRIOR ART

Further objects, features and advantages of the present invention will become apparent and this invention will be better understood from the following description, reference being made to the accompanying drawings in which:

FIGS. 1, 2 and 3 are diagrams for explaining defects of a high-frequency amplifier circuit of the prior art; and FIG. 4 through 9 are diagrammatic views which show a complete amplifier and portions thereof embodying this invention.

A circuit for effecting high-frequency amplification by utilizing a transistor may be diagrammatically shown as in FIG. 1 of the accompanying drawing in which the direct current portions are omitted. The extent of amplification of a high-frequency amplifier is limited by an unstable condition caused by oscillation which occurs with an increase in the degree of amplification. This is true not only in a single stage but also with multiple-stage amplification; generally, multiple stage amplification is more apt to create oscillations owing to its high overall gain.

Such oscillation is caused by the fact that an amplified signal is fed back to the input side. Accordingly, the designers pay much attention in decreasing as far as possible the amount of feedback in order to obtain a higher degree of satisfactory amplification. For this reason a blocking capacitor CN is used as shown in FIG. 1. For the same reason, the bodies of radio-frequency transformers and intermediate-frequency transformers are contained in metal cans or shield cases made of copper, brass, aluminum or high frequency magnetic material to dissipate energy which otherwise is statically or magnetically fed back to the preceding stage.

An example of a high-frequency step-down transformer T is shown in FIG. 2 and the contents of its casing diagrammatically shown in FIG. 3. Troubles occurring in such prior amplifier circuits are as follows. In the assembly of FIG. 1 which comprises a transistor TR, a high-frequency transformer T, a blocking capacitor CN and a tuning capacitor $C_T$, when the center tap of the primary winding of the high-frequency transformer is grounded, terminals *a* and *b* assume high-frequency potentials of relatively large magnitude.

FIG. 2 shows, in perspective, a high-frequency transformer having terminal pins 1, 2, 3, 4 and 5. In other types, too, terminal pins are required to extend out of the shield can SH. Fortunately, as transistors have much lower input impedances than vacuum tubes, and as the secondary leads or output terminals of a high-frequency transformer feeding into the transistor input have also low impedance the output terminals will not be at a high potential. As is clear from FIG. 3, terminal pins 1–3 and 4, 5 are respectively connected with the primary and secondary windings so that, if terminal 2 is grounded, then the terminals 1 and 3 would become the high-potential sides. Thus, the portions *a* and *b* would be at a high potential.

In FIG. 1, high-potential portions are shown by heavy solid lines. When only the high-frequency transformer is covered by a shield can, it is inevitable that high-potential portions of the circuit will be outside of the can since there are terminal pins and connections to the external transistor TR. While the internal capacitance of the transistor may be neutralized by means of the blocking condenser $C_N$, it is quite difficult to prevent energy from being fed back to its input side or the preceding stage from portions shown in heavy lines. As a consequence, an increase of gain or the use of multiple stages will result in the generation of oscillations. When the assembly is small (i.e. with the parts in close proximity), it is more apt to oscillate. The present invention has improved this and provides a high-frequency amplifier assembly in which it is difficult for such oscillations to arise.

Figure 4:
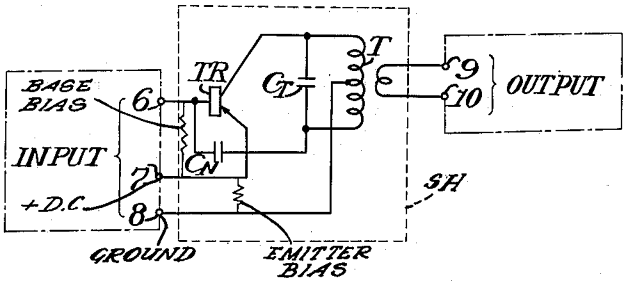
Figure 5:
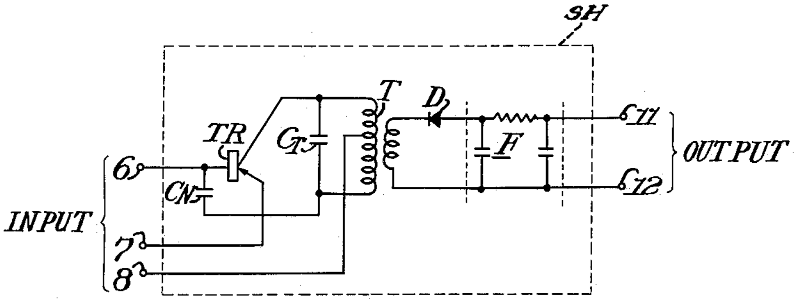

FIGS. 4 and 5 illustrate diagrammatically two examples embodying this invention. In both figures, broken lines represent shield cans covering the assembly. FIG. 4 shows a simple high-frequency transformer system constructed in accordance with this invention and comprising a high-frequency transformer T, a tuning capacitor $C_T$ connected across the primary winding of the transformer, a transistor TR, and a blocking condenser CN which are all contained in a shield can SH, input terminals 6, 7 and output terminals 9, 10 being led out through said can. The intermediate tap of the primary winding of the high-frequency transformer is taken out at 8 as the ground side so that it is at zero potential. While the circuit of FIG. 4 is essentially similar to that of FIG. 1, it should be noted that the high-potential leads or the elements directly in circuit with the high-gain or output end of the amplifier component (transistor TR) are also provided with enveloping shield means. As pointed out hereinabove, both the input and output sides of a transistor-amplifier circuit have now low impedances when compared with the impedance on the high-potential side of the high-frequency transformer so that input and output terminals can lead out of the shielded portions and do not cause any appreciable energy feedback.

In FIG. 5 there is shown another embodiment of this invention containing a detector diode D and a filter F besides a high-frequency transformer T, a transistor TR, a blocking condenser CN, a tuning capacitor $C_T$, input terminals 6, 7 and 8, and output terminals 11 and 12. In this example, the impedance of the secondary winding of the high-frequency transformer T is selected to exceed that present when a transistor is used in a following stage and also that of the embodiment shown in FIG. 4, owing to the higher load impedance presented by the diode, and instead of taking out directly the energy of the secondary winding outside of the shield can SH, the energy of the secondary winding is detected and converted to audio frequency and is thereafter led out. Furthermore, at the output terminals, by virtue of the filter action, there will be a lower high-frequency voltage than in FIG. 4. In this embodiment, portions subjected to a high-frequency voltage caused by the distorted wave due to detection are also contained in the shield can so that it is possible to prevent spurious responses caused by the high-frequency energy. In constructing this assembly, when pins for connecting the leads of the high-frequency transformer are mounted upon a base plate, it is necessary to take care that the pins on the high-potential side will not project through the shield can.

As diagrammatically illustrated in FIGS. 4 and 5, the invention consists in stabilizing a transistor-amplifier circuit having a neutralizing capacitor CN by completely shielding all of those elements or conductors which are susceptible to feedback pickup and instability. All of the high-impedance elements and all of the conductors interconnecting these high-impedance elements are fully enclosed by the metallic shield means so that no spurious feedback from subsequent stages can affect the shielded elements. Moreover, only the low-impedance terminals are led out of the shield means, these terminals being substantially free from any tendency for spurious emission pickup.

Figure 6:
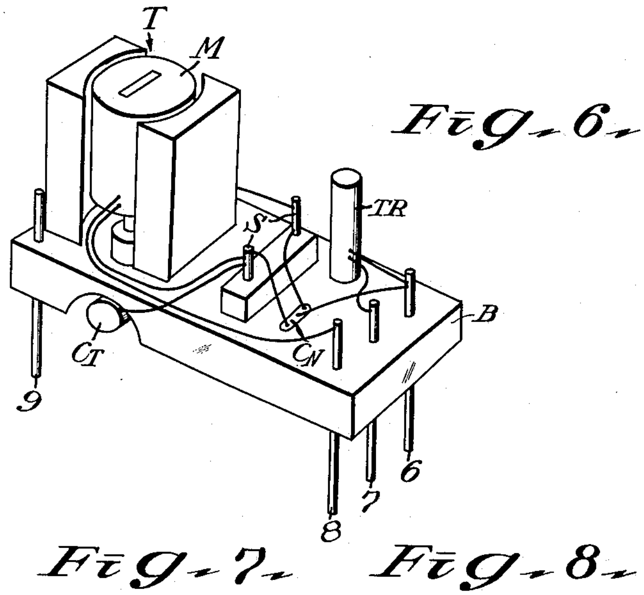
Figure 7:
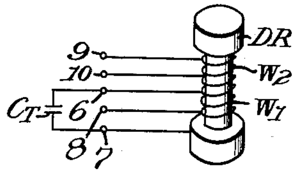
Figure 8:
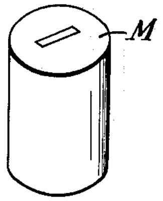
Figure 9:
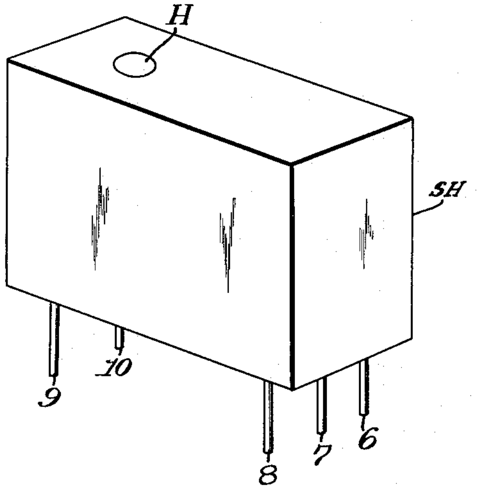

FIGS. 6, 7, 8 and 9 show perspective views of an actual construction of the embodiment of FIG. 4. As shown in FIG. 6, a high-frequency step-down transformer T is mounted on a base or supporting plate B made of an insulating material of more or less oblong rectangular shape. This transformer T comprises a drum-shaped high-frequency magnetic core DR and primary and secondary coils $W_1$ and $W_2$ wound thereon, as shown in FIG. 7, and is mounted on the base plate B, and thereafter a cup-shaped member armature M made of a high-frequency magnetic material is positioned around the transformer to provide a construction wherein the inductance can be varied by rotation of this armature. The tuning capacitor $C_T$ is disposed in a recess at the high-frequency, high potential portions of the transformer so that its conductors are not led out of the shield can. Thus, the transistor TR is connected to the terminal pins 6 and 7 on the base plate and one of the auxiliary pins S, while the blocking capacitor $C_N$ is connected to the other auxiliary pin S and the terminal pin 6. The secondary winding of the high-frequency transformer is connected to the terminal pins 9 and 10. Thus, FIG. 6 corresponds to the assembly diagrammatically shown in FIG. 4. In this case it is necessary to take care that the auxiliary pins S do not extend through the shield can. It is of course to be noted that the assembly shown in FIG. 6 is covered by a shield can to shield it electrically as well as magnetically. The completed assembly is shown in FIG. 9 wherein H represents an aperture in the shield SH for inserting an adjusting screw driver. Inasmuch as the tuning capacitor is mounted on the lower surface of the base plate in the embodiment shown in FIG. 6, it is especially preferable to provide a shield extending below the level of that plate with which it forms an enclosure. In the embodiments of this invention, such elements as an emitter stabilizing resistor for the transistor, a biasing resistor, a bias by-pass capacitor, a capacitor connected to the base of the transistor and the like may also be contained in the same shield can. Also, in addition to the diode D and filter F shown in FIG. 5, a detector resistor, the aforesaid stabilizing resistor and like elements may be included in the same shield cam. Furthermore, a tuning capacitor, transistor, diode and like elements can be disposed in a recess provided on the lower surface of the base plate B in order to reduce the size of such assembly.

It will be seen that, in an amplifier stage according to my invention, the shield surrounds the transistor TR, the transformer T with its tuned primary circuit, and other elements including part of the return connection which extends from one extremity of that tuned circuit to the base lead 6 of the transistor. The only conductors led out of this shield are the base and emitter leads 6 and 7, the conductor 8 grounding a tap on the transformer primary, and the low-voltage conductors 9, 10 (FIG. 4) or 11, 12 (FIG. 5) forming part of the output circuit connected across the secondary winding of transformer T.

While this invention has been explained by describing particular embodiments thereof, it will be apparent that improvements and modifications may be made without departing from the scope of the invention as defined in the appended claims.

What I claim as new and desire to secure by Letters Patent of the United States is:

1. A high-frequency amplifier stage, comprising an insulating supporting plate; a transistor mounted on said plate and provided with a base lead, an emitter lead and a collector lead; a step-down transformer on said plate having a high-impedance primary winding with an intermediate tap connected to a grounded conductor and a low-impedance secondary winding connected in an output circuit which includes a pair of low-voltage conductors; capacitive means on said plate connected across said primary winding and forming therewith a high-frequency oscillatory circuit; a blocking condenser mounted on said plate; a return connection including said blocking condenser extending from an extremity of said primary winding to one of said leads other than said collector lead, the other extremity of said primary winding being connected via a high-voltage conductor to said collector lead; and a single metallic shield in engagement with said plate enclosing said transformer, said transistor, said high-voltage conductor, said capacitive means and part of said return connection including said blocking condenser, there being led out of said shield only said grounded conductor, said low-voltage conductors and said base and emitter leads whereby high-frequency feedback from said oscillatory circuit to the input of said transistor is avoided.

2. An amplifier stage as defined in claim 1, further comprising a high-frequency filter network in said output circuit and a diode inserted between said secondary winding and said network, both said network and said diode being enclosed by said shield.

References Cited by the Examiner

UNITED STATES PATENTS

| | | | |
|---|---|---|---|
| 1,823,327 | 9/1931 | MacDonald et al. | 330—170 X |
| 2,111,397 | 3/1938 | Holmes | 330—170 X |
| 2,989,623 | 6/1961 | Byrne | 330—16 X |
| 3,100,282 | 8/1963 | Fletcher | 330—68 |

ROY LAKE, *Primary Examiner.*

ARTHUR GAUSS, NATHAN KAUFMAN, *Examiners.*